United States Patent [19]

Kasagi

[11] Patent Number: 5,502,006
[45] Date of Patent: Mar. 26, 1996

[54] METHOD FOR FORMING ELECTRICAL CONTACTS IN A SEMICONDUCTOR DEVICE

[75] Inventor: Yasuo Kasagi, Tokyo, Japan

[73] Assignee: Nippon Steel Corporation, Tokyo, Japan

[21] Appl. No.: 334,334

[22] Filed: Nov. 2, 1994

[30] Foreign Application Priority Data

Nov. 2, 1993 [JP] Japan .................................. 5-297259

[51] Int. Cl.$^6$ ................................................ H01L 21/44
[52] U.S. Cl. ........................... 437/195; 437/228; 437/981; 437/978; 437/197; 148/DIG. 161
[58] Field of Search ..................... 437/228, 195, 437/947, 981, 978; 156/644, 630, 653; 148/DIG. 161

[56] References Cited

U.S. PATENT DOCUMENTS

| 4,372,034 | 2/1983 | Bohr | 437/974 |
|---|---|---|---|
| 4,924,800 | 5/1990 | Tanaka | 118/50.1 |
| 5,132,774 | 7/1992 | Matsuura et al. | 357/71 |
| 5,219,791 | 6/1993 | Freiberger | 437/195 |
| 5,219,792 | 6/1993 | Kim et al. | 437/195 |
| 5,266,525 | 11/1993 | Morozumi | 437/978 |

FOREIGN PATENT DOCUMENTS

| 0200525 | 11/1986 | European Pat. Off. | 437/947 |
|---|---|---|---|
| 2-260553 | 10/1990 | Japan . | |
| 0159157 | 7/1991 | Japan | 437/978 |
| 0242937 | 10/1991 | Japan | 437/947 |
| 5-218331 | 8/1993 | Japan . | |
| 0343542 | 12/1993 | Japan | 437/978 |
| 0335299 | 12/1993 | Japan | 437/978 |

OTHER PUBLICATIONS

Mehta et al., "A Single–Pass, In–Situ Planarization Process Utilizing TEOS for Double–Poly, Double–Metal CMOS Technologies" 1989 Proceedings Sixth International IEEE VLSI Multilevel Interconnection Conference, Jun. 1989, pp. 80–88.

Primary Examiner—Tom Thomas
Assistant Examiner—Trung Dang
Attorney, Agent, or Firm—Pollock, Vande Sande & Priddy

[57] ABSTRACT

When taper portions of contact holes are etched to form wiring conductors in a semiconductor device, a hydrophobic insulating film having methyl groups on its surface is formed on a SiO$_2$ film in the low pressure CVD process, using mixed gas of tetraethyl orthosilicate TEOS and ozone O$_3$. Since the hydrophobic insulating film adheres well to a resist film, etching solution seldom soaks into between the hydrophobic insulating film and the resist film, thus wet etching is performed in the insulating film to obtain satisfactory taper portions of the contact holes.

5 Claims, 7 Drawing Sheets

METHOD FOR FORMING ELECTRICAL CONTACTS IN A SEMICONDUCTOR DEVICE

FIELD OF THE INVENTION

The present invention relates to a method for making a semiconductor device having contact structures with contact holes and/or through holes.

BACKGROUND OF THE INVENTION

In a semiconductor integrated circuit, contact holes are formed in an insulating layer on an impurity diffusion layer (for example, the source or drain of a metal oxide semiconductor MOS transistor) in a substrate to electrically connect the insulating layer and metal wiring conductors. Through holes are formed in interlayer insulating films to electrically connect multi-wiring conductors.

A conventional method for making such contact structure will be described with respect to FIG. 1. First, $SiO_2$ film 103 is formed on a Si substrate 101 on which an impurity diffusion layer 102 is formed with a source or drain of a transistor, for example. The $SiO_2$ film 103 is then coated with a photoresist film 104 of a positive type, for example, and exposed and developed, then the photoresist film 104 is patterned so as to have openings 105 directly above the impurity diffusion layer 102.

In order to form taper portions 106 which improves step coverage of a metal wiring layer at the contact holes 107, wet isotropic etching is performed with buffered hydrogen fluoride solution BHF. Dry anisotropic etching is then performed with, for example, fluorocarbon gas being masked by the photoresist film 104 to form contact holes 107 in the $SiO_2$ film 103.

While the above description relates to making the contact hole structure, a through hole structure is similarly constructed.

However, when the $SiO_2$ film 103 is subjected to wet-etching with the photoresist film 104 used as the mask, adhesion of the photoresist film 104 which is generally made of an organic substance to the $SiO_2$ film 103 is insufficient. Thus, the etching solution soaks into the interface 108 between those films 104 and 103 and hence the $SiO_2$ film is excessively etched along the interface 108, undesirably. Thus, if the $SiO_2$ film 103 is sufficiently etched, conductive paths would be formed between the contact concerned and adjacent contacts, disadvantageously.

JP-A-2-260553 (Morozumi) discloses a method of forming a through hole, comprising the steps of epitaxially growing a first silicon oxide film on an interlayer insulating film, reacting tetraethyl orthosilicate TEOS and ozone $O_3$ in vapor phase upon the first silicon oxide film to deposite a second silicon oxide film superposed on the first silicon oxide film, forming a coated glass film on the second silicon oxide film, and then plasma etching those films to form the through hole. However, Morozumi neither teaches nor suggests the above problem raised by the soaking of the etching solution into the interface in the wet etching.

JP-A-5-218331 (Yokoyama) discloses a method of forming contact holes, comprising the steps of sequentially forming a TEOS oxide film, a nitride film, and an ozone TEOS film on the whole surface of a silicon substrate, flattening the ozone TEOS film, forming a resist pattern on the flattened ozone TEOS film, etching away the ozone TEOS film, nitride film and oxide film sequentially with the resist pattern used as a mask to form the contact holes in a self-adjusting manner. First, wet etching is performed on the ozone TEOS film and then dry etching is performed on the remaining films. Yokoyama proposes damaging the ozone TEOS film at the position of the contact hole to increase the wet etching rate in order to prevent lateral erosion in the wet etching. Yokoyama neither teaches nor suggests the above problem raised by the soaking of the etching solution into the interface between the ozone TEOS film and the resist pattern in the wet etching.

SUMMARY OF THE INVENTION

It is therefore an object of the present invention to provide a method of making a semiconductor device in which the adhesion of the insulating film to the photoresist is enhanced to prevent etching solution from soaking into the interface between the insulating film and the photoresist when the taper portions are etched.

In order to solve the above problems, the present invention provides a method for making a wiring conductor for a semiconductor device, which includes the steps of, forming a lower metal wiring conductor on a semiconductor substrate, introducing TEOS and oxygen as a reactive gas over the semiconductor substrate on which the lower metal wiring conductor has been formed to form a first oxide film as an inter-layer insulating film in the plasma CVD process and making a second oxide film on the first oxide film in the low pressure CVD process, using TEOS and ozone as the reactive gases in place of the first-mentioned reactive gas. A photoresist layer is formed on the second oxide film and the photoresist patterned so as to provide an opening above the lower metal wiring conductor.

The method further includes performing wet etching on the second oxide film and the first oxide film with the photoresist film used as a mask to form a contact hole, removing the photoresist film, and forming an upper wiring metal conductor which fills in the contact hole in the second oxide film and is connected with the lower metal wiring conductor.

The present invention also provides a method for making a semiconductor device, which includes the steps of forming a second insulating film having a hydrophobic surface on a first insulating film in which contact holes should be formed, patterning on the second insulating film a photoresist film which has an opening located directly above the contact holes to be formed, performing wet etching on the first and second insulating films with the photoresist film used as a mask, and performing anisotropic etching on the first insulating film with the photoresist film used as a mask to form the contact holes.

In one aspect of the present invention, the second insulating film is formed of mixed gas of tetraethyl orthosilicate TEOS and ozone $O_3$ in the low pressure chemical vapor deposition process CVD.

In another aspect of the present invention, the first insulating film is made of mixed gas of TEOS and normal oxygen molecules $O_2$ in the plasma CVD process. The second insulating film is made continuously on the first insulating film by changing $O_2$ to $O_3$.

In still another aspect of the present invention, the ratio of flow of TEOS to $O_3$ is adjusted in a range of between 1:1 and 1:10 when the second insulating film is formed.

In a further aspect of the present invention, there is provided a method of making semiconductor device, including the steps of introducing mixed gas of TEOS and $O_3$ into the vicinity of a surface of a substrate in which a conductor is exposed to form an insulating film on the substrate in the low pressure CVD process, forming a photoresist pattern film on the insulating film and having openings located directly above the conductor, performing wet etching on the insulating film with the photoresist pattern film as a mask, and performing anisotropic-etching on the insulating film with the photoresist pattern film as a mask to form contact holes directly above the conductor.

Since in the method of the present invention, the surface of the insulating film in contact with the photoresist pattern film is hydrophobic, adhesion of the photoresist pattern, which is hydrophobic likewise, to the insulating film is increased to thereby prevent the etching solution from soaking into the interface between the insulating film and the photoresist pattern film in the wet-etching.

The insulating film having a hydrophobic surface may be made by, for example, mixed gas of TEOS and $O_3$ in the low pressure CVD process.

DESCRIPTION OF THE PREFERRED EMBODIMENTS

A first embodiment of the present invention will be described with reference to FIGS. 2A–2C and 3A–3B.

Figure 2A:
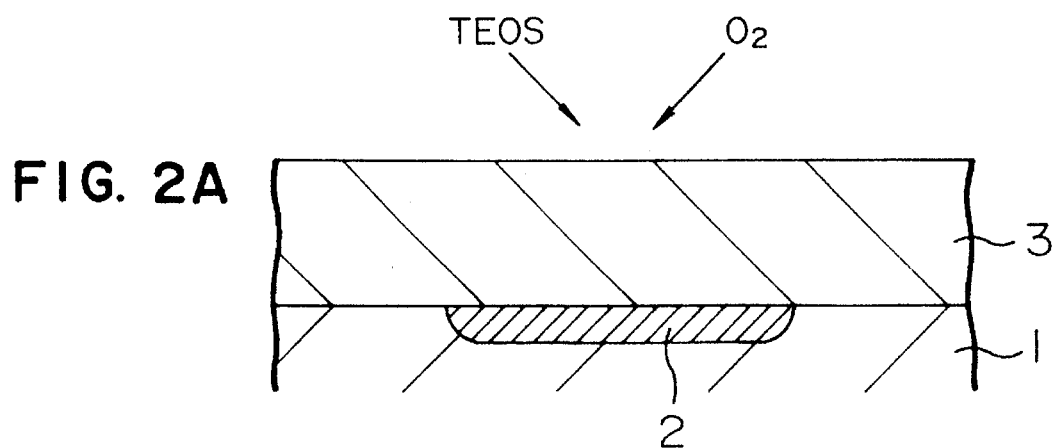
FIGS. 2A–2C are cross-sectional views indicative sequentially of the steps of the method of making semiconductor devices as a first embodiment of the present invention.

As shown in FIG. 2A, mixed gas of tetraethyl orthosilicate TEOS and molecular oxygen $O_2$ is introduced over Si substrate 1, having formed therein an impurity diffusion layer 2 in which source and drain of transistors will be made with, to form a plasma oxide film 3 having thickness of 1 μm in the plasma chemical vapor deposition process CVD. At this time, the flow rate of TEOS is set at about 20 sccm (standard cubic centimeters per minute reduced in the standard conditions).

Figure 2B:
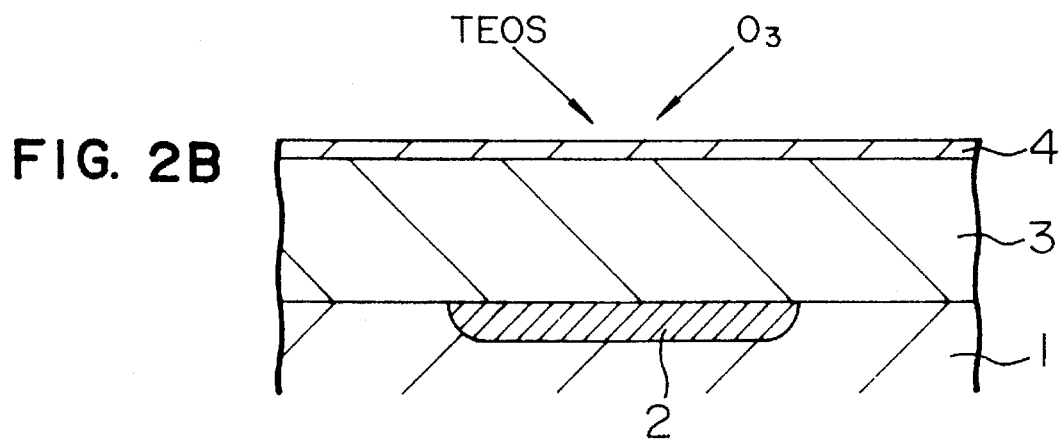

As shown in FIG. 2B, supply of $O_2$ is stopped, then supply of ozone ($O_3$) is started immediately, and the substrate is exposed to the mixed gas of TEOS and $O_3$ for about 5 minutes. At this time, the flow of TEOS is set at about 20 sccm similar to the flow of TEOS supplied for forming the plasma oxide film 3, the flow of $O_3$ is set at about 100 sccm, pressure in the reactor (not shown) is set at about 10 Torr, and temperature of the Si substrate 1 is set at about 400° C. In this low pressure CVD process, a TEOS-$O_3$ film 4 made by the thermal CVD process (in the specification, referred to as "low pressure CVD film") having thickness of several tens of Angstroms is formed on the plasma oxide film 3. The low pressure CVD film 4 is an insulating film having a hydrophobic surface which includes methyl group (—$CH_3$).

Figure 2C:
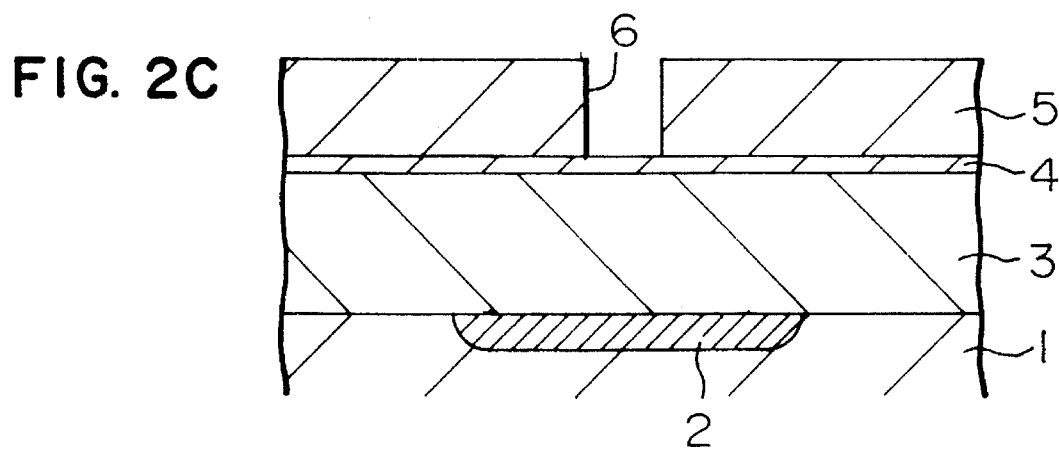

As shown in FIG. 2C, the reactor is evacuated and the Si substrate 1 is taken out, a positive photoresist film 5 of novolak type is coated on the low pressure CVD film 4, and exposed and developed, then the photoresist layer 5 is patterned so as to have opening 6 directly above the impurity diffusion layer 2. At this time, the low pressure CVD film 4 having a hydrophobic surface well adheres to the photoresist film 5 which is hydrophobic likewise.

Figure 1:
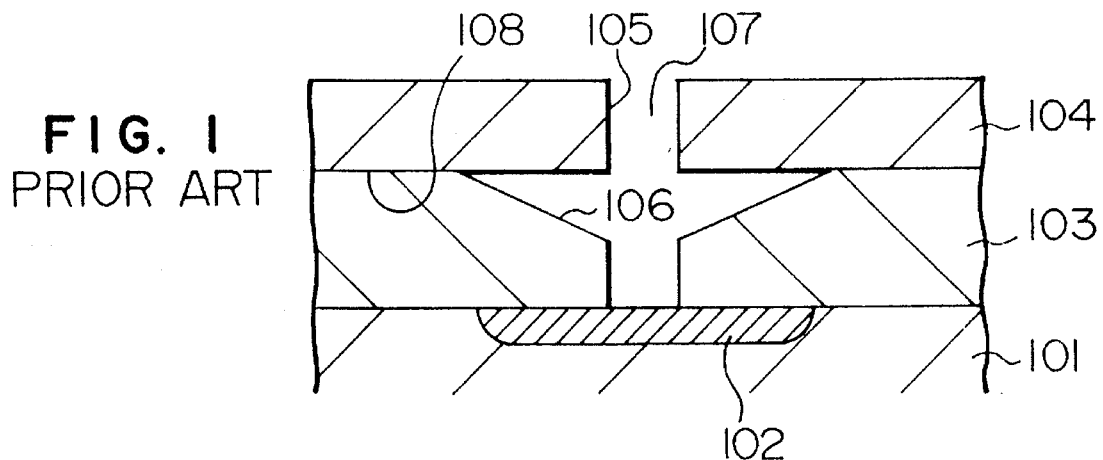
FIG. 1 is a cross-sectional view illustrative of a method of making a conventional semiconductor device.
Figure 3A:
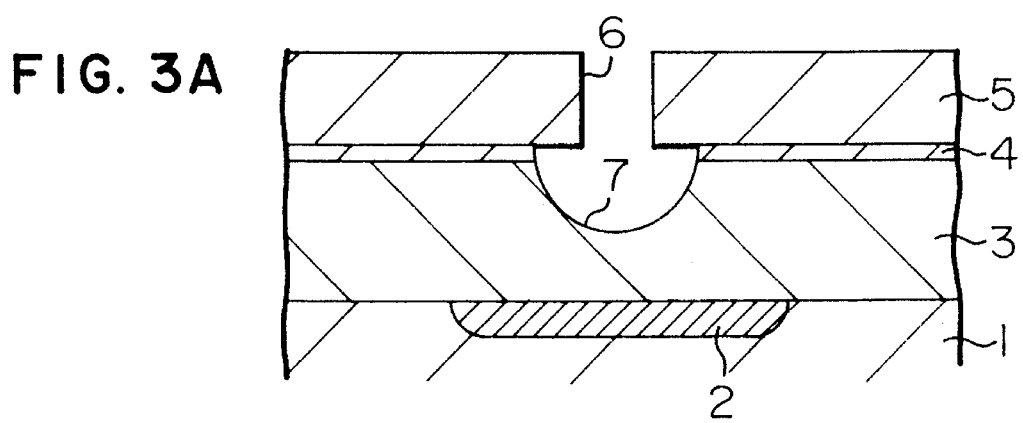
FIGS. 3A, 3B are cross-sectional views indicative sequentially of the further steps of the method of making semiconductor devices as the first embodiment of the present invention.

As shown in FIG. 3A, the surface of the plasma oxide film 3 is subjected to wet etching by about 3000 Angstroms with buffered hydrogen fluoride solution BHF masked by the photoresist film 5. At this time, since the low pressure CVD film 4 is well adhered to the photoresist film 5, BHF solution does not soak into the interface between the low pressure CVD film 4 and the photoresist film 5. Thus, no etching of the plasma oxide film 3 advances along its interface, but the surface of the plasma oxide film 3 is subjected to substantially isotropic etching to thereby form a taper portion 7.

Figure 3B:
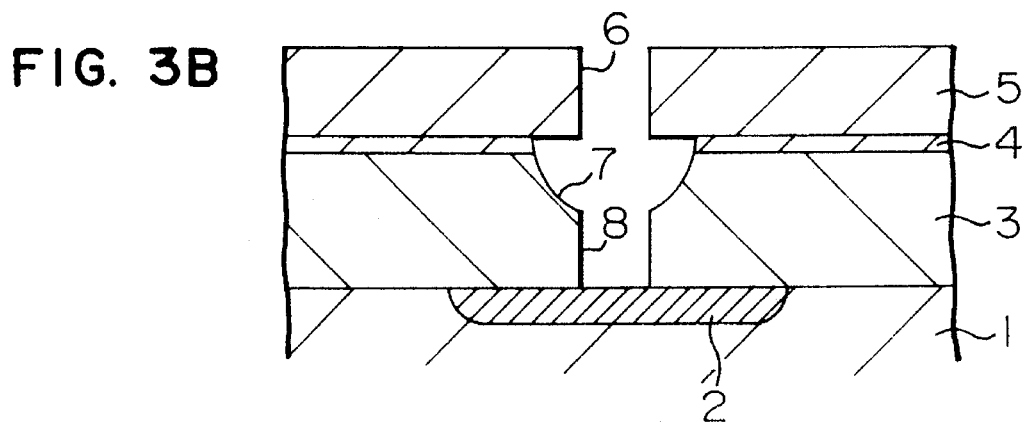

As shown in FIG. 3B, the plasma oxide film 3 is then subjected to anisotropic etching by about 7000 Angstroms with the photoresist film 5 used as a mask in a fluorocarbon gas atmosphere to form contact hole 8 which reaches the impurity diffusion layer 2. The photoresist film 5 is then removed, and aluminum wiring conductors (not shown) are formed so as to fill the contact hole 8.

While in the above embodiment the plasma oxide film 3 is formed in the plasma CVD process in the mixed gas of TEOS and $O_2$, and supply of $O_3$ is started in place of supply of $O_2$ to form the low pressure CVD film 4 subsequently in the same reactor, the low pressure CVD film 4 may be formed in a separate reactor after the plasma oxide film 3 is formed. Alternatively, a silane oxide film or a boron phosphor silicon glass BPSG film may be used in place of the plasma oxide film 3. In these cases, the thickness of the low pressure CVD film 4 is preferably set such as to substantially maintain the speed of the etching of the whole insulating film with the BHF solution.

Alternatively, the whole insulating film may be formed of a low pressure CVD film 4. In that case, the thickness of the low pressure CVD film 4 is required to be more than 3000 Angstroms.

The ratio of flow of TEOS to $O_3$ employed when the low pressure CVD film 4 is formed is preferably in a range of between 1:1 and 1:10 and more preferably 1:4 and 1:5.

According to the method of the invention, since adhesion of the insulating film to the photoresist film is enhanced, no etching solution soaks into the interface between those films in the wet etching. Thus, for example, when the taper portions of the contact hole are formed by wet etching, excessive lateral etching which would otherwise be caused by soaking of the etching solution is prevented to thereby form satisfactory taper shaped portions which have no continuity path with the adjacent contact holes.

Figure 4A:
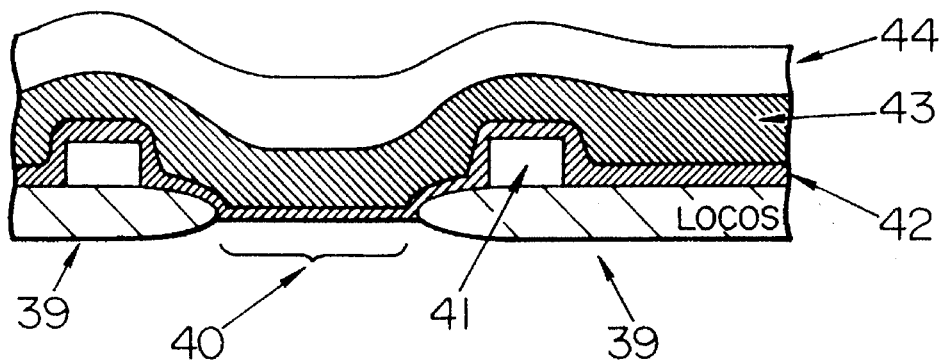
FIGS. 4A–4M are cross-sectional views indicative sequentially of the steps of the wiring conductor forming method as a second embodiment of the present invention applied to an insulating film provided between multi-layered metal wiring conductors.

FIGS. 4A–4M, 5 and 6 show application of the present invention to insulating films between multi-layered metal wiring conductors. A transistor shown in FIG. 5 which is a cross section perpendicular to the cross section of FIGS. 4A–4M, is formed in a device area 40 surrounded by a local oxidization of silicon on sapphire LOCOS layer 39 shown in FIG. 4A. In FIG. 5, reference numeral 41 denotes a gate electrode made of polysilicon, 37 and 38 a drain and a source or vice versa, 44 an aluminum wiring layer connected with the drain or source, and 46 and 48 oxide films used for inter-layer insulation.

The gate electrode 41 of FIG. 5 is formed of the polysilicon layer of the gate wiring layer 41 shown in FIGS. 4A–4M. The low pressure CVD process is performed on a semiconductor substrate, on which the gate wiring layer 41 is formed, in TEOS gas fed at flow rate of 100 sccm, at the temperature of 700° C., and at the internal pressure of 1 Torr to form an oxide film 42 having thickness of about 100 nm. A BPSG film 43 having thickness of about 500 nm is then formed on the oxide film 42 for flattening purposes. The film forming conditions are to use boron B of 3.0 wt % and phosphor P of 6.0 wt %.

After flattening the BPSG film 43 and forming the contact holes to the diffusion layer for source and drain 37, 38 of FIG. 5, an aluminum wiring layer 44 having thickness of about 500 nm is formed as a lower wiring layer by sputtering at the temperature of 200° C. in argon gas atmosphere having pressure of 6 mTorr and at power supply of 10 kw so as to fill the contact holes with aluminum.

Figure 4B:
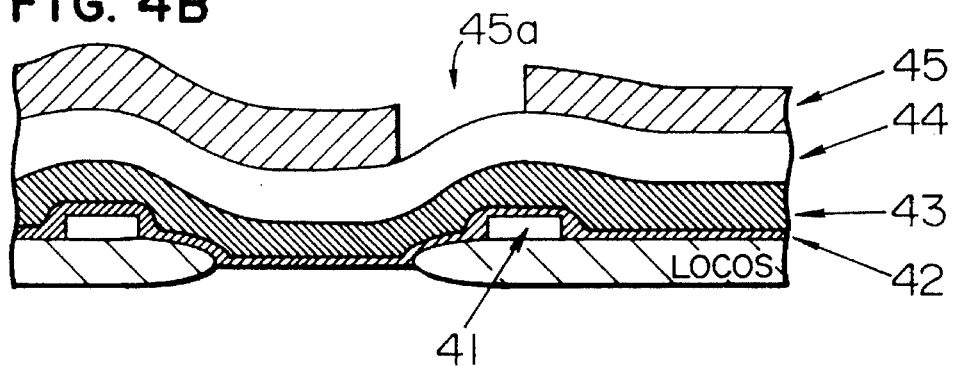
Figure 4C:
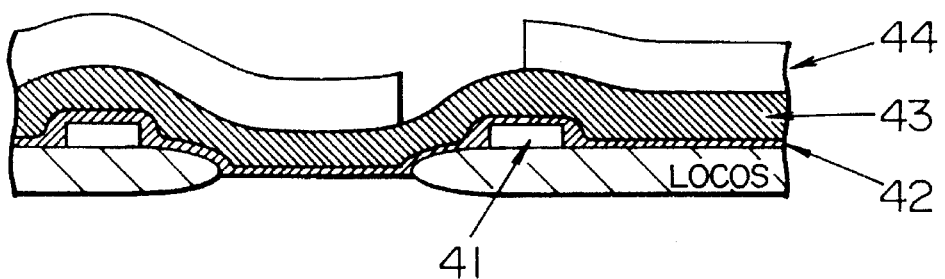
Figure 4D:
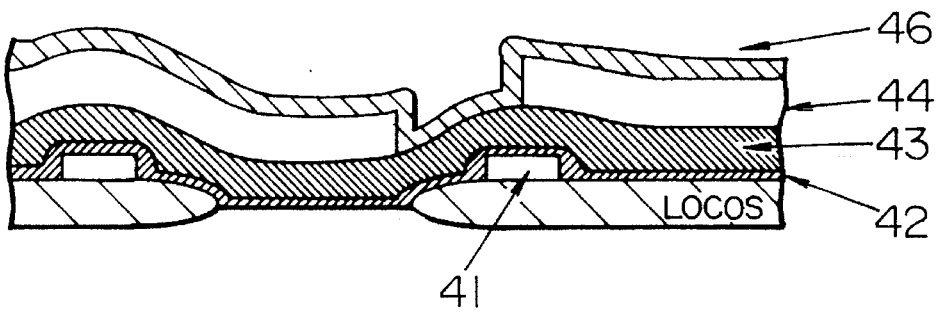
Figure 4E:
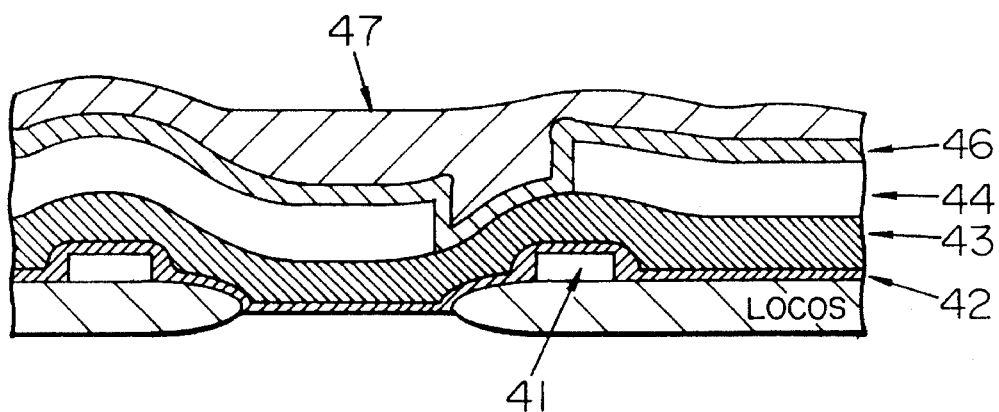

As shown in FIG. 4B, a patterned resist film 45 is then formed on the aluminum wiring layer 44 which is to be patterned by etching. As a result, the lower wiring layer 44 of FIG. 4C is obtained. The aluminum wiring layer 44 is connected with the source/drain layers of the transistor of FIG. 5 at positions in the perpendicular direction to the cross section of FIGS. 4A–4M. Openings 45a in the resist film 45 of FIG. 4B are provided for separating the aluminum wiring layer 44 for each transistor. The aluminum wiring layer 44 thus patterned is connected with an upper wiring layer on the device separating area 39. As shown in FIG. 4D, an oxide film 46 having thickness of 0.4 μm is formed for interlayer isolation on the aluminum wiring layer 44 in the plasma CVD process at temperature of 400° C., RF frequency of 13.56 MHz, flow rate of 50 sccm of TEOS and 400 sccm of $O_2$, pressure of 10 Torr, and power of 400 w, in reaction gas atmosphere of TEOS and oxygen.

Figure 4F:
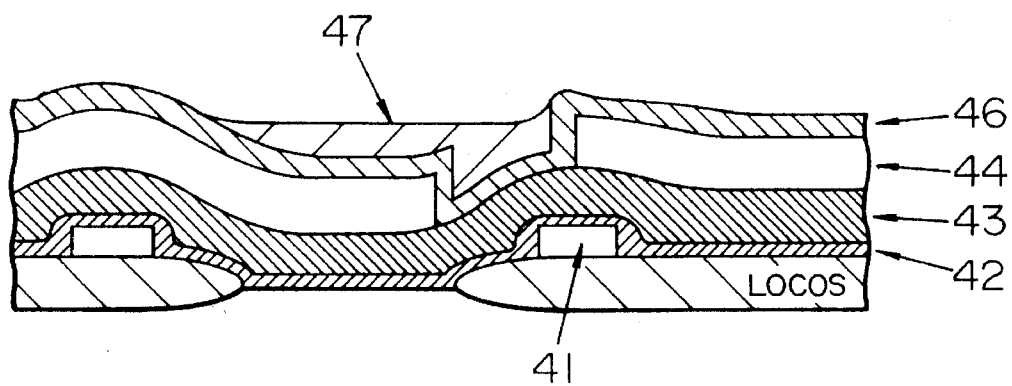
Figure 4G:
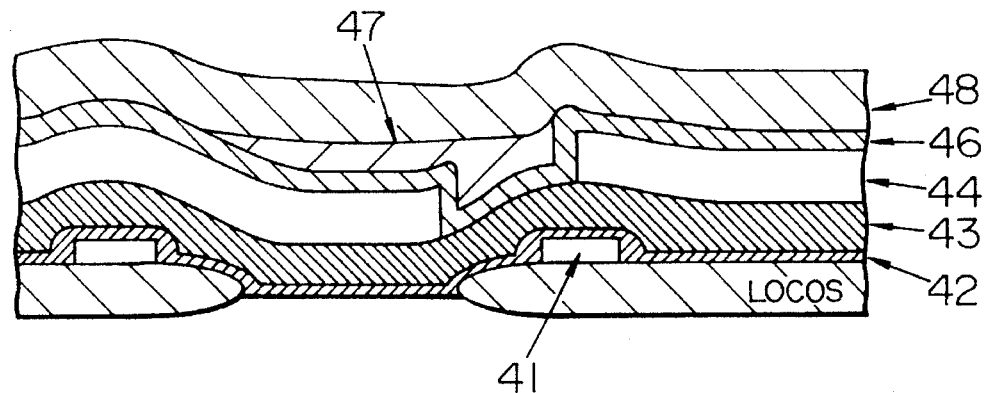
Figure 4H:
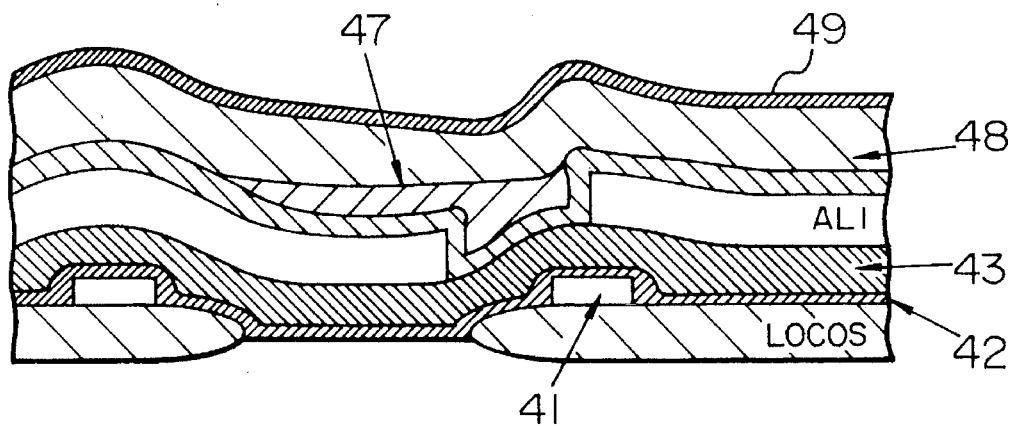
Figure 5:
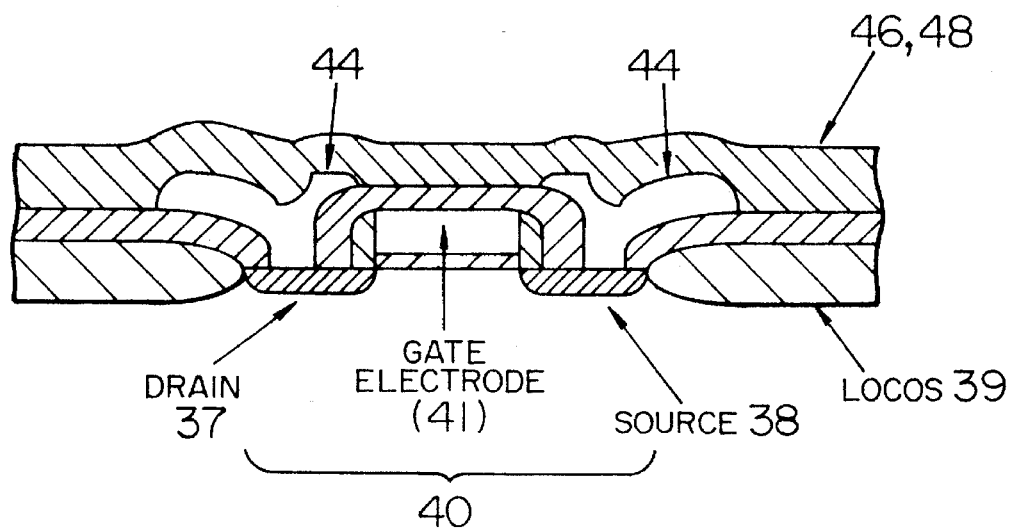
FIG. 5 is a cross-sectional view of the semiconductor device perpendicular to the cross section shown in FIG. 4 of the semiconductor device as the second embodiment.

In order to flatten the outer surface of the oxide film 46, the surface of the oxide film 46 is coated with a silicon oxide glass SOG film 47 (for example, of type 2 produced by Tokyo Oka Kogyo KK) (FIG. 4E) and the recesses are etched back to be filled with SOG 47 (FIG. 4F). The plasma CVD is then performed in reactive gas of TEOS and oxygen to form on the films 46 and 47 a plasma oxide film 48 having thickness of about 0.6 μm. The flow rate of TEOS is about 50 sccm. The remaining conditions are the same as those in the formation of the oxide film 46 (FIG. 4G).

The supply of the oxygen gas into the CVD reactor is stopped and the supply of the ozone gas is started simultaneously such that the substrate is exposed to the new reactive gas of TEOS and ozone for about 5 seconds. The flow of TEOS is about 20 sccm, the flow of ozone is about 100 sccm, the pressure in the reactor is 10 Torr, and the temperature of the silicon substrate is about 400° C. Thus, an ozone-TEOS oxide film 49 is formed on the plasma oxide film 48 in the low pressure CVD process (FIG. 4H) to increase adhesion of the plasma oxide film 48 to a resist film 50 to be formed in the next step.

Figure 4I:
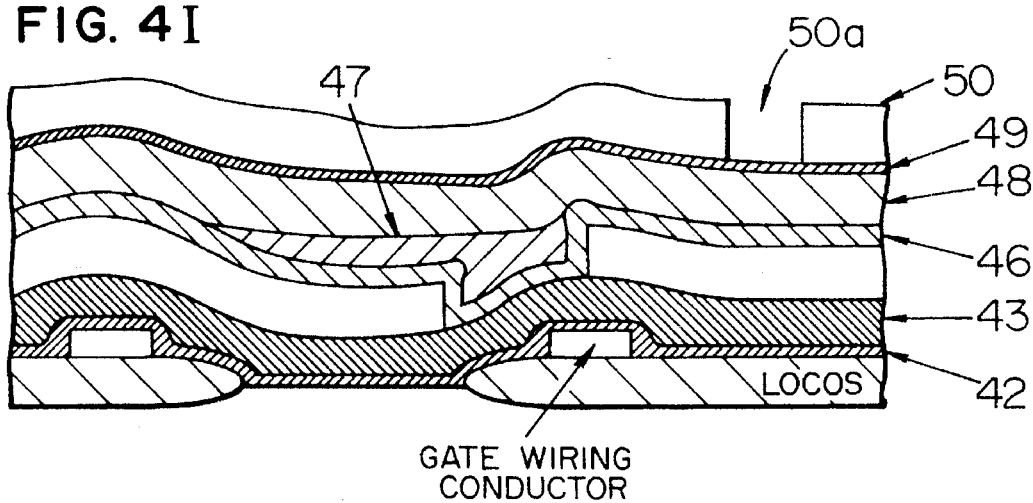

The ozone-TEOS oxide film 49 is coated with a novolak positive photoresist film 50, and the photoresist film 50 is selectively exposed and developed to form an etching mask for forming contact holes 50a, as in FIG. 4I.

Figure 4J:
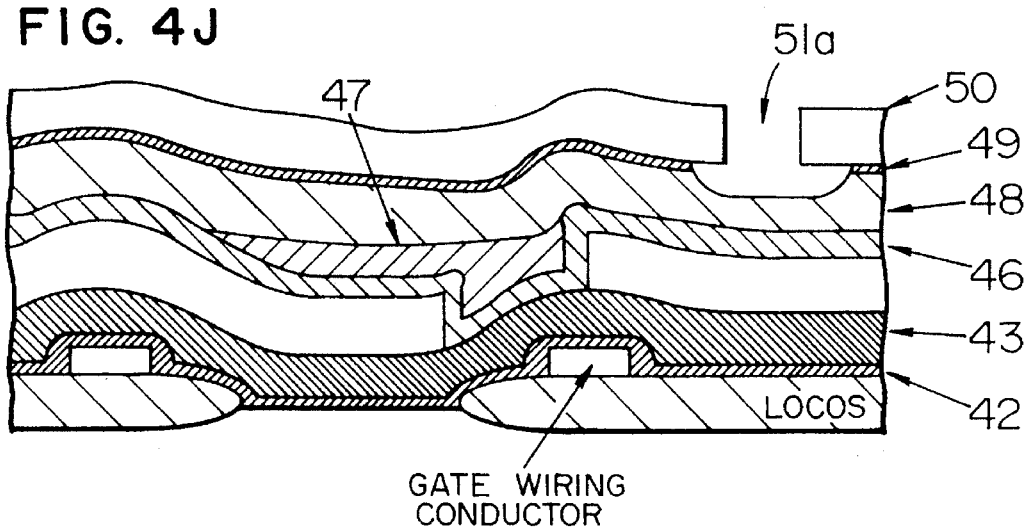

Wet etching is performed using the resist film 50 as a mask and then selectively etching back on the ozone-TEOS oxide film 49 and the oxide film 48 to form taper portions 51a in the upper part of prospective contact holes 51 as shown in FIG. 4J. BHF solution is preferably used for the etching.

At this time, although etching expands laterally in the interface between the resist film 50 and the ozone-TEOS oxide film 49 and between the ozone-TEOS oxide film 49 and the oxide film 48, the resist film 50 and the ozone-TEOS oxide film 49 are both hydrophobic and well adhere to each other. Thus, etching solution does not tend to soak into the interface between the respective films and the etching has shorter lateral expansion as compared to that in a structure in which the resist film 50 and the plasma oxide film 48 are in direct contact with each other. Thus, appropriate taper portions may be formed in the upper portion of the contact holes (FIG. 4J).

Figure 4K:
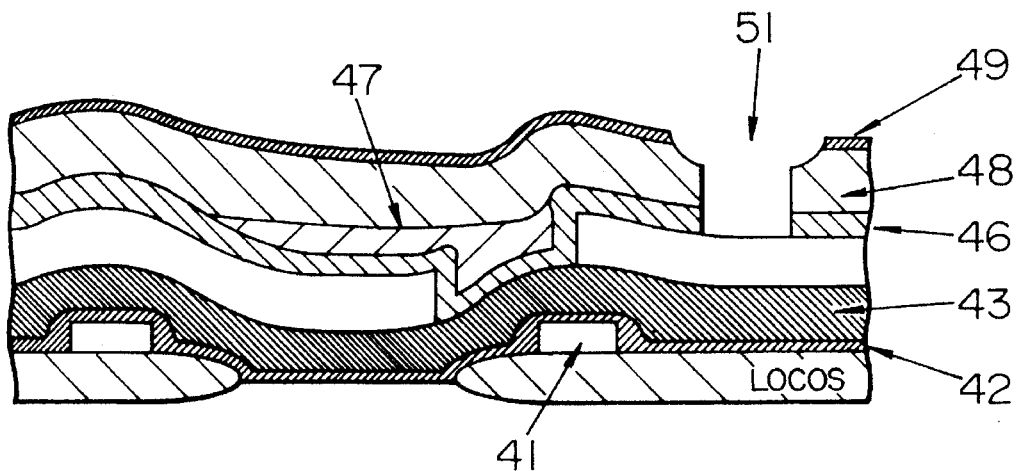

The oxide films 48 and 46 are subjected to dry etching to form the contact hole 51 which reaches the lower aluminum wiring layer 44 (FIG. 4K). The etching conditions required when a parallel-plain plate etcher device is used are flow rate of 60 sccm of $CF_4$ and 60 sccm of $CHF_3$, flow rate of 800 sccm of argon, pressure of 1 Torr and supply of 700 w of RF power. Since the dry etching is anisotropic, etching is selectively performed in vertical direction to form a substantially vertical contact hole portion which reaches the underlying aluminum layer 44 under the taper portion.

Figure 4L:
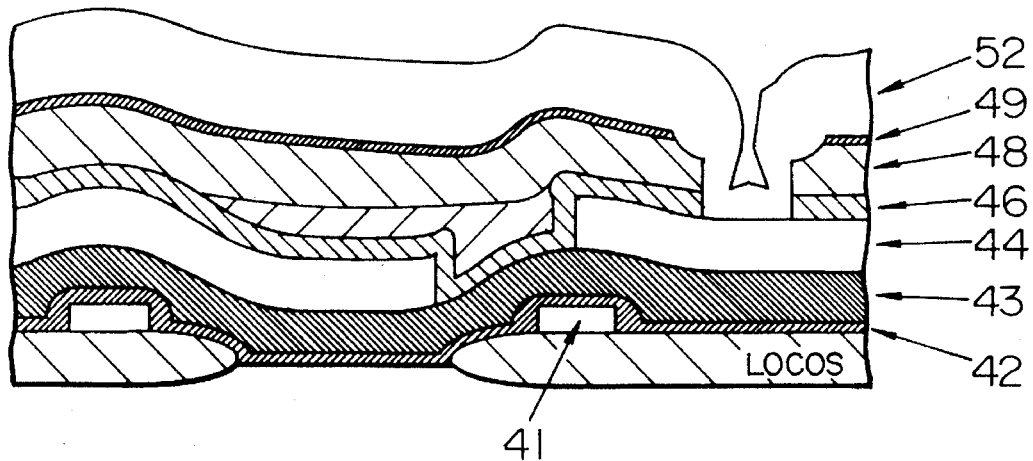

An aluminum layer 52 which will be an upper wiring conductor is formed by sputtering within the contact hole 51 thus formed (FIG. 4L).

Figure 4M:
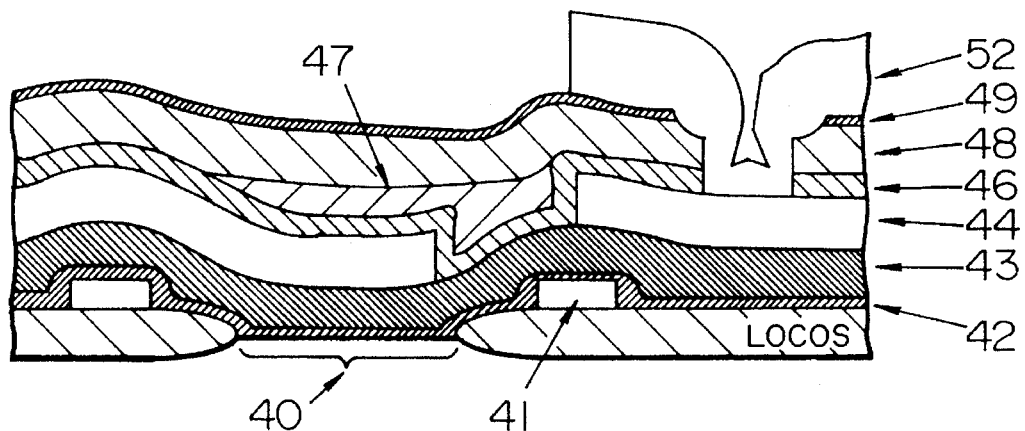

Thereafter, the aluminum layer 52 is patterned to form the upper wiring conductor (FIG. 4M). A passivation film (not shown) is then formed as the uppermost layer to complete the wiring.

The reason why the SOG film 47 is formed between the first and second plasma oxide films 46 and 48 is to achieve both flat surface and stable insulation because the plasma oxide films 46 and 48 have stable in insulation characteristic as compared to the SOG film 47. In fact, the SOG film 47 has high water absorptivity, and is likely to absorb moisture and to corrode the aluminum wiring conductor. In addition, since the SOG film 47 is also formed uniformly through the non-wiring area (not covered with the upper and lower wiring conductors as viewed in a plan view), the SOG film 47 can influence adversely the underlying substrate and diffusion layer. Then the first and second plasma oxide films 46 and 48 of high hydrophobia sandwich the SOG film 47 of high hygroscopicity to solve the above problem.

The second plasma oxide film 48 is covered with the ozone-TEOS oxide film 49 which is more hydrophobic than the second plasma oxide film 48 to prevent the etching solution from soaking into between the photoresist pattern film 50 and the second plasma oxide film 48 to thereby prevent over-etching on the interface of the photoresist pattern film 50.

The ozone-TEOS oxide film 49 is formed so as to have very small thickness of several tens of Angstroms, for example, which is about 1/50 of 3000 Angstrom thickness of the first and second plasma oxide films 46 and 48. Since the step of forming the ozone-TEOS oxide film is performed in the low pressure CVD process, its forming speed is slower compared to that in the plasma CVD process. Thus, the ozone-TEOS oxide film 49 is formed only to cover the upper surface of the second plasma oxide film 48 to be contacted with the photoresist film. Considering absorbed moisture quantity in the ozone-TEOS oxide film 49 based on wave number of 3450 $cm^{-1}$ due to moisture involved in the infrared spectroscopy, the moisture absorption coefficient is about 500 $cm^{-1}$, which is much higher when compared to the moisture absorption coefficient of the plasma oxide films 46 and 48 less than 100 $cm^{-1}$. Therefore, the absorbed moisture may affect characteristics of the semiconductor device. From the standpoint of the reliability of the device, most preferably, the plasma oxide films should be used for the lower layer closer to the semiconductor substrate and the ozone-TEOS oxide film 49 should be used for the upper layer in contact with the resist film as in the present embodiment.

Figure 6:
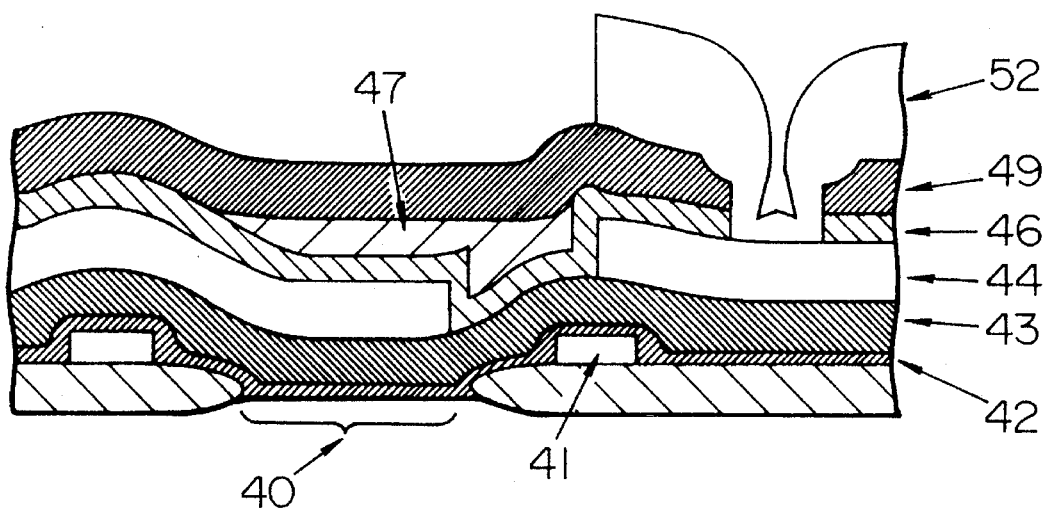
FIG. 6 is a cross-sectional view of a modification of the semiconductor device including a single plasma oxide layer involved in the execution of the second embodiment.

Alternatively, as shown in FIG. 6, a semiconductor device may include only one plasma oxide film 46 and an ozone-TEOS oxide film 49 provided on the plasma oxide film 46, in contrast with the previous devices in which the two plasma oxide films 46 and 48 are provided. The plasma oxide film 46 in this case should be thicker than in the embodiment of FIG. 4 in order to solve the problem of absorptivity.

The oxide film used for the inter-layer insulation film between the multi-layered wiring conductors has a low melting point when a metal such as aluminum is used for the lower wiring conductors. Therefore, when an oxide film is to be formed by thermal oxidation, metal contamination occurs through the aluminum wiring layer to the underlying semiconductor layer to thereby deteriorate the characteristic of the transistor. Thus, a low temperature process such as CVD is used.

What is claimed is:

1. A method of making a wiring conductor for a semiconductor device, comprising the steps of:

forming a lower metal wiring conductor over a semiconductor substrate;

introducing a first reactive gas including tetraethyl orthosilicate TEOS and oxygen $O_2$ over the semiconductor substrate to form a first plasma oxide film in a plasma CVD process;

coating the semiconductor substrate with a glass film;

heating the semiconductor substrate;

flattening the surface of the semiconductor substrate over which the lower metal wiring conductor, the first plasma oxide film and the glass film are formed;

introducing a second reactive gas including TEOS and $O_2$ over the semiconductor substrate to form a second plasma oxide film in a plasma CVD process, at least a part of the second plasma oxide film being formed on the glass film;

forming an ozone-TEOS oxide film on the second oxide film in a low pressure CVD process, using TEOS and ozone $O_3$ as a third reactive gas in place of the second reactive gas;

forming a photoresist layer on the ozone-TEOS oxide film and patterning the photoresist layer so as to form an opening above a part of the lower metal wiring conductor;

making a contact hole reaching the lower metal wiring conductor by etching the ozone-TEOS oxide film and the second plasma oxide film, with the photoresist layer used as a mask;

removing the photoresist layer; and forming an upper metal wiring conductor on the ozone-TEOS oxide film, the upper metal wiring conductor filling the contact hole and being connected with the lower metal wiring conductor;

wherein said etching comprises a step of wet etching at least an upper part of the ozone-TEOS oxide film to form a taper portion in an upper portion of the contact hole, and a step of an anisotropic etching at least the second plasma oxide film to form a lower portion of the contact hole which reaches the lower metal wiring conductor.

2. A method of making a wiring conductor for a semiconductor device, comprising the steps of:

forming a lower metal wiring conductor over a semiconductor substrate;

introducing a first reactive gas including tetraethyl orthosilicate TEOS and oxygen $O_2$ over the semiconductor substrate to form a plasma oxide film in a plasma CVD process;

coating the semiconductor substrate with a glass film;

heating the semiconductor substrate;

flattening the surface of the semiconductor substrate over which the lower metal wiring conductor, the plasma oxide film and the glass film have been formed;

forming an ozone-TEOS oxide film on the plasma oxide film in a low pressure CVD process, using TEOS and ozone $O_3$ as a second reactive gas in place of the first reactive gas, at least a part of the ozone-TEOS oxide film being formed on-the glass film;

forming a photoresist layer on the ozone-TEOS oxide film and patterning the photoresist layer to form an opening above a part of the lower metal wiring conductor;

making a contact hole reaching the lower metal wiring conductor by etching the ozone-TEOS oxide film and the plasma oxide film, with the photoresist layer used as a mask;

removing the photoresist layer; and forming an upper metal wiring conductor on the ozone-TEOS oxide film, the upper metal wiring conductor filling the contact hole and being connected with the lower metal wiring conductor;

wherein said etching comprises a step of wet etching at least an upper part of the ozone-TEOS oxide film to form a taper portion in an upper portion of the contact hole, and a step of an anisotropic etching at least the plasma oxide film to form a lower portion of the contact hole which reaches the lower metal wiring conductor.

3. A method of making a semiconductor device, comprising the steps of:

providing a first insulating film in which a contact hole is formed;

forming a second insulating film on the first insulating film, the second insulating film having a hydrophobic surface;

forming and patterning a photoresist film on the second insulating film, the photoresist film having an opening directly above the contact hole to be formed;

performing wet etching on at least a part of the second insulating film with the photoresist film used as a mask; and performing anisotropic etching on the first insulating film with the photoresist film used as a mask, wherein:

the second insulating film is made from a mixed gas of tetraethyl orthosilicate TEOS and ozone $O_3$ in a low pressure CVD process; and a ratio of the flow of TEOS to the flow of $O_3$ is adjusted in a range of between 1:1 and 1:10 when the second insulating film is formed.

4. A method according to claim 3, wherein:

the first insulating film is made from a mixed gas of TEOS and normal oxygen $O_2$ in a plasma CVD process; and the second insulating film is made continuously on the first insulating film by changing $O_2$ to $O_3$.

5. A method according to claim 3, wherein said hydrophobic surface of said second insulating film includes methyl group ($-CH_3$).

* * * * *